US006238973B1

(12) United States Patent
Pyun (10) Patent No.: US 6,238,973 B1
(45) Date of Patent: May 29, 2001

(54) METHOD FOR FABRICATING CAPACITORS WITH HEMISPHERICAL GRAINS

(75) Inventor: Jung-Woo Pyun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/323,306

(22) Filed: Jun. 1, 1999

(30) Foreign Application Priority Data

Jun. 2, 1998 (KR) .................................................. 98-20444

(51) Int. Cl.[7] .............................................. H01L 21/8242
(52) U.S. Cl. ........................ 438/255; 438/289; 438/396; 438/964
(58) Field of Search ................................. 438/255, 964, 438/396, 254, 398, 397, 253, 665, 753, 977, 239

(56) References Cited

U.S. PATENT DOCUMENTS

| 5,134,086 | 7/1992 | Ahn .......................................... 437/52 |
| 5,227,322 | 7/1993 | Ko et al. ................................. 437/47 |
| 5,342,800 | 8/1994 | Jun ............................................ 437/52 |
| 5,407,534 | 4/1995 | Thakur ................................... 156/662 |
| 5,447,878 | * 9/1995 | Park et al. ............................. 438/396 |
| 5,597,754 | 1/1997 | Lou et al. ................................ 437/52 |
| 5,618,747 | 4/1997 | Lou ......................................... 438/398 |
| 5,650,351 | 7/1997 | Wu ............................................ 437/52 |
| 5,674,782 | 10/1997 | Lee et al. .............................. 437/193 |
| 5,716,883 | 2/1998 | Tseng ...................................... 438/253 |
| 5,759,894 | 6/1998 | Tseng et al. ........................... 438/255 |
| 5,804,480 | 9/1998 | Lu et al. ................................. 438/253 |
| 5,814,526 | 9/1998 | Tseng ...................................... 437/60 |
| 5,837,579 | * 11/1998 | Huang .................................... 438/255 |
| 5,843,822 | 12/1998 | Hsia et al. ............................. 438/254 |
| 5,849,624 | 12/1998 | Fazan et al. ........................... 438/398 |
| 5,858,834 | 1/1999 | Hirota et al. .......................... 438/253 |
| 5,869,368 | 2/1999 | Yew et al. .............................. 438/255 |

* cited by examiner

Primary Examiner—Charles Bowers
Assistant Examiner—Yennhu B. Huynh
(74) Attorney, Agent, or Firm—Myers Bigel Sibley & Sajovec (57) ABSTRACT

A method for fabricating a semiconductor device including a lower electrode layer provided at a surface thereof with hemispherical grains, an upper electrode layer, and a dielectric layer interposed between the lower and upper electrode layers, involving dry etching a conduction layer, formed for the lower electrode layer, in such a fashion that the lower electrode layer has an increased dopant concentration at the surface thereof while exhibiting a minimum etch damage thereof. In accordance with this method, it is possible to prevent a reduction in the dopant concentration at the surface of hemispherical grains formed on the lower electrode layer. Thus, a high Cmin/Cmax ratio is obtained.

1 Claim, 5 Drawing Sheets

METHOD FOR FABRICATING CAPACITORS WITH HEMISPHERICAL GRAINS

BACKGROUND OF THE INVENTION

1. Field of the Invention

The present invention relates to a method for fabricating semiconductor devices, and more particularly to a method for fabricating capacitors with a structure having hemispherical grains, thereby being capable of achieving an increase in the minimum capacitance-to-maximum capacitance ratio (hereinafter, referred to as a "Cmin/Cmax" ratio).

2. Description of the Related Art

In a semiconductor memory device, such as a dynamic random access memory (DRAM), including a plurality of memory cells each consisting of one access transistor and one storage capacitor, cell capacitance is important for an improvement in cell memory characteristics in that it serves to improve the read-out ability of the memory device while reducing the soft error rate (SER). However, the recent high integration trend of semiconductor devices inevitably involves a reduction in the cell area per cell, thereby resulting in a reduction in the area occupied by the capacitor. For this reason, it is essentially required to achieve an increase in the capacitance per cell area, in addition to an increase in the integration degree.

Generally, capacitance is proportional to how much area is shared by lower and upper electrode layers. A number of efforts have continuously been made to increase the surface area of the lower electrode layer in a limited space. Most of such efforts are concerned with lower electrode layer structures. By virtue of such efforts, capacitors have been developed from planar capacitor structures, which were initially proposed, up to three-dimensional capacitor structures such as those of stacked capacitors or trenched capacitors. However, attempts to increase capacitance by an improved lower electrode layer structure as mentioned above encounter problems such as a limited design rule and complicated fabrication processes. To this end, proposals have been made to utilize physical properties of the lower electrode layer, thereby achieving an increase in capacitance. Of these proposals, one is disclosed in U.S. Pat. No. 5,385,863, wherein hemispherical grains (HSG) are formed on the surface of a lower electrode layer, thereby increasing the surface area of the lower electrode layer. In accordance with this method, an amorphous silicon layer is formed over a wafer using a low pressure chemical vapor deposition (LPCVD) process. Phosphorous (P) ions are then implanted in the amorphous silicon layer. Subsequently, the surface of the amorphous silicon layer is cleaned, thereby removing a natural oxide film existing thereon. The resulting wafer is then loaded in a chamber defined in an ultra-high vacuum CVD device. The chamber is maintained at an ultra-high vacuum of $10^{-9}$ Torr. In the chamber, the wafer is heated to a desired temperature ranging from 500° C. to 620° C. Under this condition, source gas such as silane ($SiH_4$) or disilane ($Si_2H_6$) is supplied into the chamber, so that crystal nucleuses are formed on the amorphous silicon layer. This technique is generally called a "crystal seeding process". After the formation of the crystal nucleuses, the resulting wafer is subjected to a thermal treatment in high vacuum. By this thermal treatment, the crystal nucleuses are grown into hemispherical grains. Consequently, the amorphous silicon layer is transformed into a polysilicon layer having an irregular surface.

Now, a conventional method for fabricating capacitors with hemispherical grains will be described in conjunction with FIGS. 1 and 2. The following description will be made only in conjunction with a unit cell.

Figure 1:
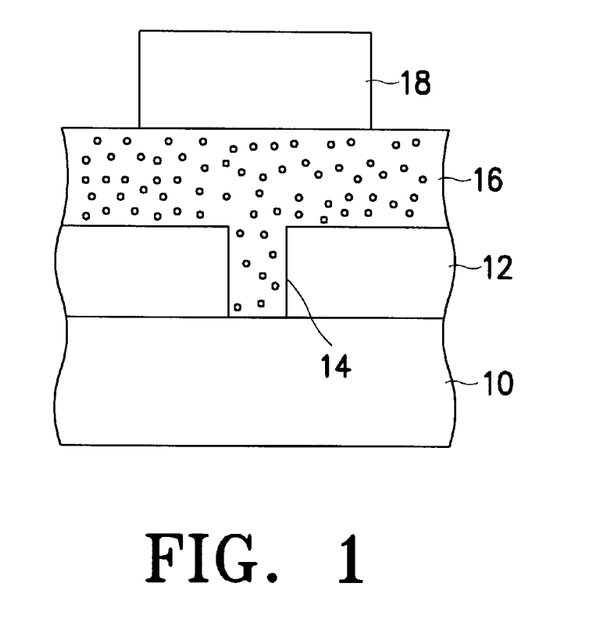
FIGS. 1 and 2 are cross-sectional views respectively illustrating a conventional method for fabricating capacitors of a semiconductor device.

Referring to FIG. 1, an insulating layer 12 is first formed over a semiconductor substrate 10 formed with a transistor (not shown). The insulating layer 12 is then etched using a photolithography process, thereby forming a contact hole through which an active region, for example, a source region of the transistor, is exposed. An amorphous silicon layer 16 is subsequently deposited over the insulating layer 12 including the contact hole 14 in accordance with an LPCVD process. The amorphous silicon layer 16 is then doped with phosphorous (P) ions. Thereafter, a photoresist film pattern 18, which is to be used for the formation of a lower electrode layer constituting a part of a capacitor, is formed on the amorphous silicon layer 16. Using the photoresist film pattern 18 as an etch mask, the amorphous silicon layer 16 is then dry etched by use of chlorine ($Cl_2$)-based plasma, so that it is patterned to have a shape corresponding to a desired lower electrode layer shape. As the amorphous silicon layer 16 is dry etched, its side walls are damaged. As a result, an inclined side wall profile is obtained.

Figure 2:
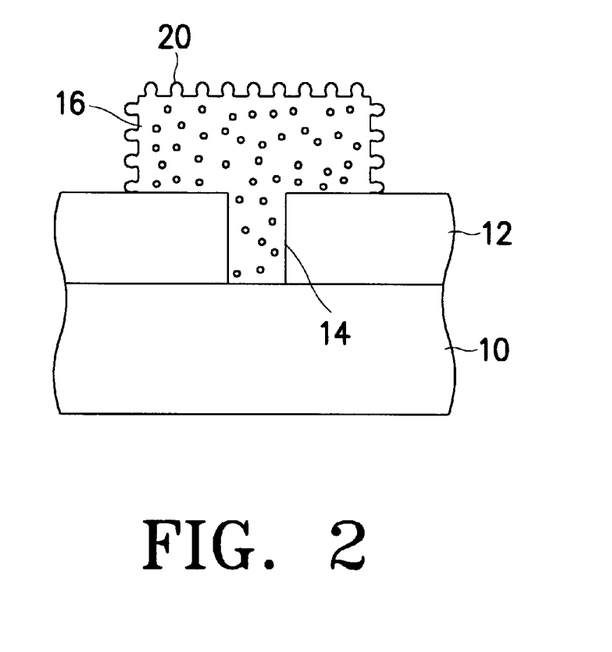

As shown in FIG. 2, the photoresist film pattern 18 is then removed, thereby exposing the patterned amorphous silicon layer 16. Subsequently, hemispherical grains 20 are grown over the amorphous silicon layer 16 using a well-known crystal seeding process and thermal treatment process. A subsequent thermal treatment at a temperature of about 800° C. is carried out for the amorphous silicon layer 16, thereby causing the amorphous silicon layer 16 to be transformed into a polysilicon layer as a lower electrode layer. Although not shown, a dielectric layer and an upper electrode layer are then sequentially formed on the lower electrode layer with the hemispherical grains 20, thereby obtaining a capacitor.

Figure 3:
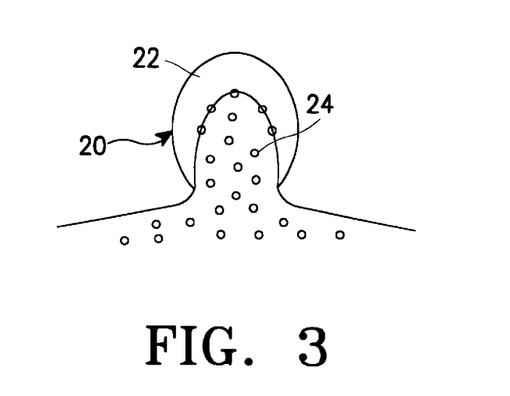
FIG. 3 is an enlarged view of one of hemispherical grains shown in FIG. 2.

FIG. 3 is an enlarged view of one of hemispherical grains 20 shown in FIG. 2. Referring to FIG. 3, it can be found that there is no migration of phosphorous (P) ions 24 to the surface 22 of the hemispherical grain 20. This is because an etch damage of the side walls of the amorphous silicon layer 16, which occurs during the dry etching of the amorphous silicon layer 16, results in an easy crystallization of amorphous silicon during a subsequent growth of hemispherical grains, thereby forming grain boundaries interfering with a migration of the P ions.

When the concentration of the dopant, namely, P ions, at the surfaces 22 of the hemispherical grains 20 decreases, the capacitance of the capacitor varies depending on the direction in which bias is applied to the capacitor, namely, the direction in which electric field is applied to the dielectric layer. This will be described in more detail.

Typically, when data is stored in a capacitor, electrons or holes concentrate on the surface of the lower electrode layer of a capacitor by virtue of electric field generated due to a differential voltage potential across both nodes of the dielectric layer. In particular, where the dielectric layer exhibits a higher potential at the lower node thereof than at the upper node thereof, holes in the lower electrode layer migrate toward the upper electrode layer due to the electric field applied to the dielectric layer. As a result, those holes concentrate on the surface of the lower electrode layer. When the concentration of the dopant at the surfaces of hemispherical grains decreases, carriers in the surface of the lower electrode layer are offset with each other, thereby forming a depletion layer. This depletion layer serves as a parasitic capacitor. Assuming that "Cd" and "Cc" represent the capacitance of such a parasitic capacitor and the capacitance generated by the dielectric layer, respectively, a relationship of Cd<<Cc is established.

Since the upper electrode layer, the parasitic capacitor resulting from the deletion layer, and the capacitor resulting from the dielectric layer, and the lower electrode are coupled together in series, the total capacitance Ct is expressed as follows:

$$Ct = \frac{(Cc * Cd)}{(Cc + Cd)}$$

Taking into consideration the relationship of Cd<<Cc, it can be found from the above equation that a relationship of Ct<Cc is established. This means that the Cmin/Cmax ratio is reduced.

For DRAM products, the minimum capacitance Cmin has a very important meaning. This is because a "high" potential level is used upon storing data of "1". The use of a "high" potential level means that such a "high" potential level is applied to the lower node of the capacitor. In other words, it is meant that the potential of the upper node is higher than that of the lower node. As a result, if the concentration of the dopant at the surfaces of hemispherical grains decreases, the capacitor is then charged in a reduced quantity upon storing data of "1", as compared to the case in which data of "0" is stored. Such asymmetric capacitance results in a degradation in the performance of the entire semiconductor chip.

SUMMARY OF THE INVENTION

Therefore, an object of the invention is to provide a method for fabricating capacitors, which is capable of increasing the concentration of a dopant at the surfaces of lower electrode layers with hemispherical grains, thereby obtaining a high Cmin/Cmax ratio.

Another object of the invention is to provide a method for fabricating capacitors, which is capable of migrating dopant ions in lower electrode layers to the surfaces of hemispherical grains formed on the surfaces of the lower electrode layers, thereby obtaining a high Cmin/Cmax ratio.

Another object of the invention is to provide a method for fabricating a DRAM device, which is capable of increasing the concentration of a dopant at the surfaces of lower electrode layers included in storage capacitors, thereby obtaining a high Cmin/Cmax ratio.

In accordance with one aspect, the present invention provides a method for fabricating a semiconductor device including a lower electrode layer provided at a surface thereof with hemispherical grains, an upper electrode layer, and a dielectric layer interposed between the lower and upper electrode layers, comprising the step of: dry etching a conduction layer, formed for the lower electrode layer, in such a fashion that the lower electrode layer has an increased dopant concentration at the surface thereof while exhibiting a minimum etch damage thereof.

Preferably, the dry etching step is carried out in such a fashion that the lower electrode layer has side walls with a vertical profile.

Preferably, the dry etching step is carried out in accordance with a plasma etch process using hydrobromide (HBr) gas, chlorine (Cl$_2$) gas, and helium dioxide (HeO$_2$) gas. It is also preferred that the hydrobromide gas, chlorine gas and helium dioxide gas have a ratio of 8:2:1.

In accordance with another aspect, the present invention provides a method for fabricating a semiconductor device including a lower electrode layer, an upper electrode layer, and a dielectric layer interposed between the lower and upper electrode layers, comprising the step of: patterning a conduction layer using a dry etch process, thereby forming a lower electrode layer; and growing hemispherical grains on an exposed surface of the lower electrode layer; and wherein the dry etching process is carried out in such a fashion that the conduction layer exhibits a minimum etch damage, so that dopant ions doped in the lower electrode layer migrate from the lower electrode layer to exposed surfaces of the hemispherical grains during the subsequent growth of the hemispherical grains.

In accordance with another aspect, the present invention provides a method for fabricating a dynamic random access memory device including a plurality of memory cells each including an access transistor consisting of a source region, a drain region and a gate electrode, and a storage capacitor consisting of a lower electrode layer, a dielectric layer, and an upper electrode layer, comprising the steps of: forming an insulating layer over a semi-conductor substrate formed with the transistor; etching the insulating layer, thereby forming a contact hole through which the source region is exposed; depositing a conduction layer over the entire upper surface of the resulting structure obtained after the formation of the contact hole; dry etching the conduction layer in such a fashion that the conduction layer has an increased dopant concentration at the surface thereof while exhibiting a minimum etch damage thereof, thereby forming a lower electrode layer being in contact with the source region through the contact hole; and growing hemispherical grains on an upper surface of the lower electrode layer.

Preferably, the dry etching process for the conduction layer is carried out in such a fashion that the conduction layer exhibits a minimum etch damage, so that dopant ions doped in the lower electrode layer migrate from the lower electrode layer to exposed surfaces of the hemispherical grains during the subsequent growth of the hemispherical grains.

Preferably, the dry etching step is carried out in such a fashion that the lower electrode layer has side walls with a vertical profile.

Preferably, the conduction layer is formed by depositing a doped amorphous silicon layer over the entire upper surface of the structure obtained after the formation of the contact hole in accordance with a low pressure chemical vapor deposition process.

Preferably, the amorphous silicon layer is transformed at a surface portion thereof into a polysilicon layer at the hemispherical grain growth step.

Preferably, the method further comprises the steps of forming a dielectric layer on the lower electrode layer after the hemispherical grain growth step, and forming an upper electrode layer on the dielectric layer.

In accordance with the capacitor fabrication method of the present invention as mentioned above, the patterning of the lower electrode layer of a capacitor is carried out using a dry etch process while minimizing the etch damage of the amorphous silicon layer. After this patterning, hemispherical grains are grown over the lower electrode layer. Accordingly, dopant ions doped in the lower electrode layer can easily migrate from the lower electrode layer to the surfaces of the hemispherical grains, thereby preventing the dopant concentration at those hemispherical grain surfaces from being reduced. Thus, a high Cmin/Cmax ratio is obtained.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 4:
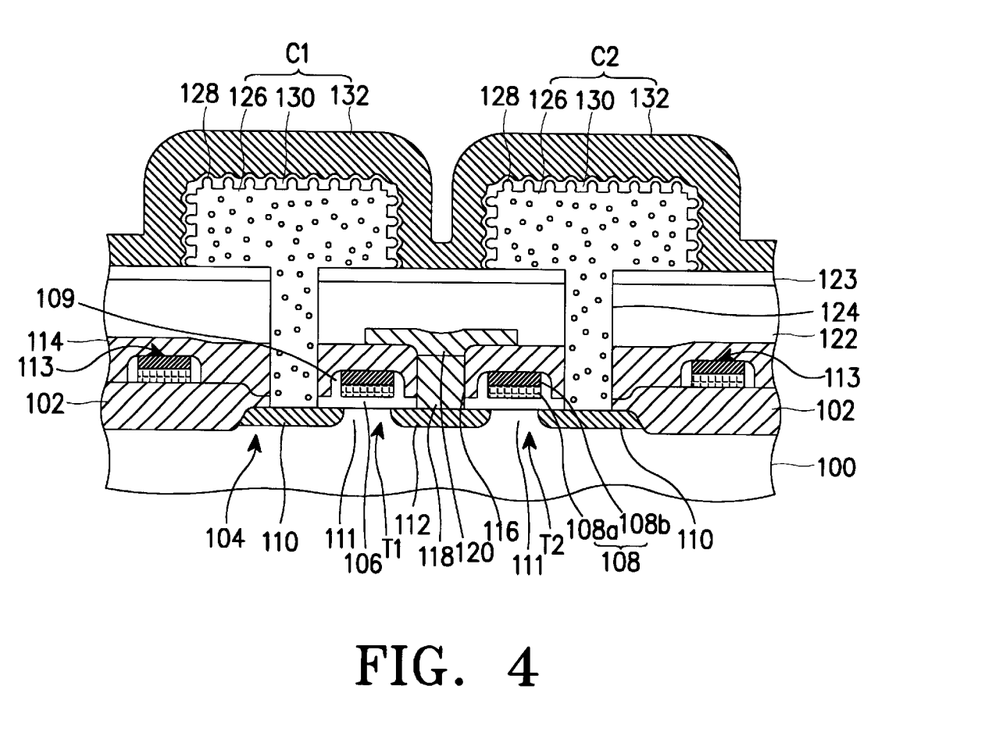
FIG. 4 is a cross-sectional view illustrating a part of a DRAM device to which an embodiment of the present invention is applied.

FIG. 4 is a cross-sectional view illustrating a part of a DRAM device to which an embodiment of the present invention is applied.

Referring to FIG. 4, a pair of access transistors T1 and T2 are formed respectively on active regions 104 of a semiconductor substrate 100 which are deemed by field oxide films 102. For these access transistors T1 and T2, source regions 110 are formed in the surface of the substrate 100. A common drain region 112 is also formed in the surface of the substrate 100 in such a fashion that it is spaced from the source regions 110 by channel regions 111, respectively. Gate oxide films 106 are formed on the channel regions 111, respectively. Gate electrodes 108 are formed on the gate oxide films 106, respectively. Side wall insulating films 109 are formed on both side walls of each gate electrode 108. Preferably, the gate electrodes 108 are comprised of a polycide layer consisting of a doped polysilicon layer 108a and a metal silicide layer 108b. Word lines 113 are disposed on the field oxide films 102, respectively, in such a fashion that they extend from the gate electrodes of access transistors adjacent to the. access transistors T1 and T2, respectively.

A first interlayer insulating film 114 covers the word lines 113 and access transistors T1 and T2. A first contact hole 116 is formed through the first interlayer insulating film 114 in such a fashion that the common drain region 112 is partially exposed through the first contact hole 116. A plug 118, which is made of doped polysilicon or tungsten, is filled in the first contact hole 116 so that it is in contact with the common drain region 112. This plug 118 is coupled to a bit line 120 made of doped polysilicon, metal, polycide, or silicide.

A second interlayer insulating film 122 and an insulating layer 123 are sequentially deposited over the bit line 120 and first interlayer insulating film 114. Second contact holes 124 are also provided which extend through the first and second interlayer insulating films 114 and insulating layer 123 in such a fashion that the source regions 110 are partially exposed through the second contact holes 124, respectively. Storage capacitors C1 and C2 are disposed on the insulating layer 123. Each of the storage capacitors C1 and C2 has a lower electrode layer 126 with hemispherical grains 128. Respective electrode layers 126 of the storage capacitors C1 and C2 are in contact with the source regions 110 through the second contact holes 124. A dielectric layer 130 and an upper electrode layer 132 are sequentially deposited over the lower electrode layers 126.

A method for fabricating such a DRAM device having the above mentioned structure in accordance with the present invention will now be described in detail, in conjunction with FIGS. 5 to 9.

Figure 5:
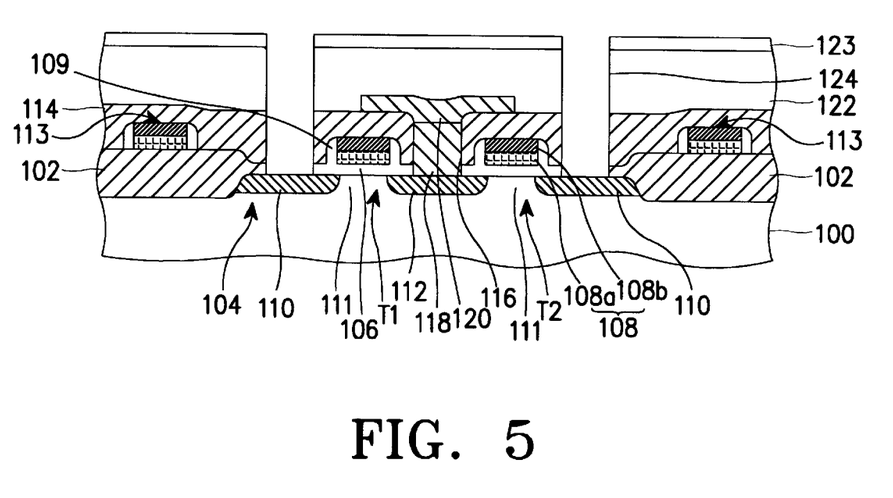
FIGS. 5 to 9 are cross-sectional views respectively illustrating a method for fabricating the DRAM device of FIG. 4 in accordance with the present invention.

FIG. 5 illustrates the step of forming the insulating layer 123 and second contact holes 124. First, a P type semiconductor substrate 100 is prepared. Field oxide films 102 are then formed on the substrate 100 using a well-known element isolation process, for example, a local oxidation of silicon (LOCOS) process or an improved LOCOS process, thereby dividing the substrate 100 into active regions 104 and inactive regions. Thereafter, gate oxide films 106 are formed on the active regions 104, respectively, using a dry or wet oxidation process. Subsequently, a conduction layer is deposited over the resulting structure and then patterned using a photolithography process, thereby forming gate electrodes 108. Preferably, the gate electrodes 108 are comprised of a polycide layer consisting of a doped polysilicon layer 108a and a metal silicide layer 108b. Using the gate electrodes 108 as an ion implantation mask, N type impurity ions are then implanted in the surfaces of the active regions 104, thereby forming source regions 110 and a common drain region 112. Thus, access transistors T1 and T2 are obtained.

Thereafter, a first interlayer insulating film 114 is formed over the resulting structure formed with the access transistors T1 and T2. The first interlayer insulating film 114 is then etched to remove its portion disposed over the drain region 112, thereby forming a first contact hole 116 through which the drain region 112 is partially exposed. Subsequently, a plug 118 is filled in the first contact hole 116. Preferably, the plug 118 is made of doped polysilicon or tungsten. A conduction layer is then deposited over the entire upper surface of the resulting structure including the upper surface of the plug 118 and the surface of the first interlayer insulating film 114. This conduction layer is patterned using a photolithography process, thereby forming a bit line 120. Preferably, the bit line 120 is made of doped polysilicon, metal, polycide, or silicide.

Then, a second interlayer insulating film 122, which is, for example, comprised of a borophosphosilicate glass (BPSG) film, is deposited to a thickness of about 3,000 Å over the resulting structure formed with the bit line 120. An insulating film 123, which is, for example, comprised of a high temperature oxide (HTO) film, is deposited to a thickness of about 2,000 Å over the second interlayer insulating film 122. This insulating layer 123 will serve as an etch stop in a subsequent dry etch process for an amorphous silicon layer to be subsequently formed. Thereafter, the first and second interlayer insulating films 114 and 122, and insulating layer 123 are etched to remove their portions disposed over the source regions 110, thereby forming second contact holes 124 through which the source regions 110 are partially exposed, respectively.

Figure 6:
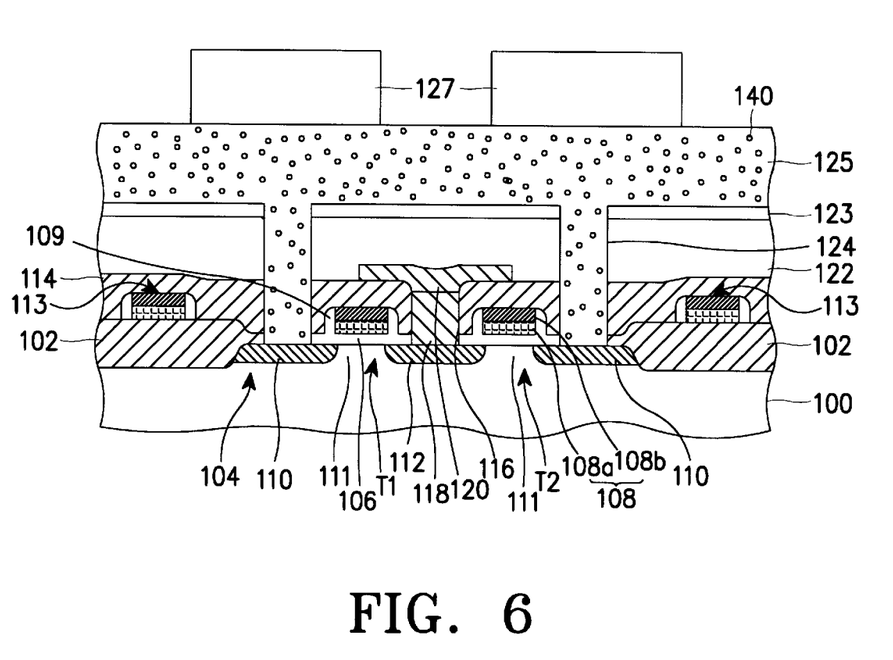

FIG. 6 illustrates the step of forming a doped amorphous silicon layer 125 and a photoresist film pattern 127. As shown in FIG. 6, an amorphous silicon layer 125 doped with an N type dopant, for example, P ions 140, is deposited to a thickness of about 6,500 Å over the resulting structure obtained after the formation of the second contact holes 124 using an LPCVD process. The amorphous silicon layer 125 is filled in the second contact holes 124. Alternatively, the second contact holes 124 may be filled with a P-doped polysilicon layer prior to the formation of the amorphous silicon layer 125. Preferably, the amorphous silicon layer 125 is doped in a concentration of $1 \times 10^{20}$ atoms/cm$^3$.

After the formation of the amorphous silicon layer 125, a photoresist film is coated over the amorphous silicon layer 125. This photoresist film is then patterned using a light exposure and development process, thereby forming a photoresist film pattern 127 on a region where the lower electrode layer of a capacitor will be formed.

Figure 7:
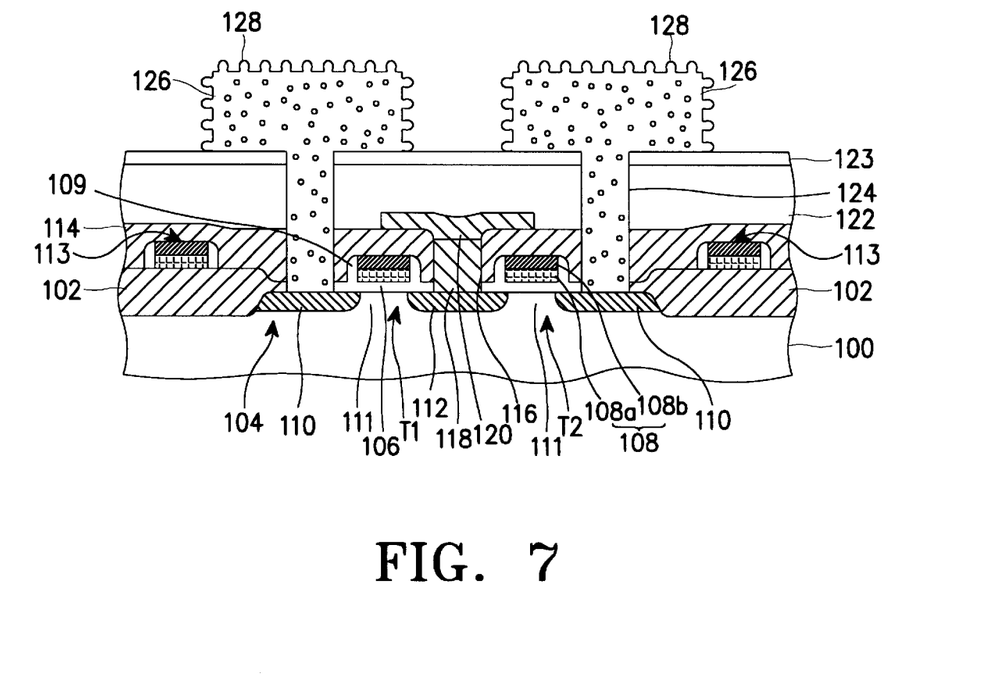

FIG. 7 illustrates the step of forming lower electrode layers 126 and hemispherical grains 128. Using the photoresist film pattern 127 as an etch mask, the amorphous silicon layer 125 is dry etched, thereby forming lower electrode layers 126 for capacitors of unit cells electrically isolated from one another. Preferably, the dry etching is carried out in accordance with a plasma etch process using hydrobromide (HBr) gas, chlorine ($Cl_2$) gas, and helium dioxide ($HeO_2$) gas so that the lower electrode layers 126 have a vertical profile. This will be described in more detail. The wafer is first is loaded in a chamber defined in a P-5000 device manufactured by Applied Material Company. In the chamber, the amorphous silicon layer 125 is dry etched until an etch stop is detected under the condition using a chamber pressure of about 100 mT, RF power of about 350 W while flowing, in the chamber, hydrobromide gas at a flow rate of about 120 SCCM (standard cubic centimeter perminute), chlorine gas at a flow rate of about 30 SCCM, and helium dioxide gas at a flow rate of about 15 SCCM. Thereafter, the amorphous silicon layer 124 is over-etched for about 120 seconds under the condition using a chamber pressure of about 80 mT, RF power of about 200 W while flowing, in the chamber, hydrobromide gas at a flow rate of about 50 SCCM, chlorine gas at a flow rate of about 10 SCCM, and helium dioxide gas at a flow rate of about 5 SCCM.

During the dry etch process, the chlorine ($Cl_2$) gas serves as a main etchant whereas the helium dioxide ($HeO_2$) gas serves to enhance the etch selectivity between tie amorphous silicon layer 125 and the insulating layer 123 comprised of an oxide film. The hydrobromide (HBr) gas serves to enhance the etch selectivity between the amorphous silicon layer 125 and the photoresist film 127. Preferably, the hydrobromide gas, chlorine gas and helium dioxide gas are used in a ratio of 8:2:1. In accordance with the dry etch process of the present invention, the amorphous silicon layer 125 is vertically etched. Accordingly, it is possible to minimize the etch damage of its side walls while maintaining a high concentration of P ions in the lower electrode layers 126.

In order to obtain an increased integration degree of memory cells by reducing the space between adjacent lower electrode layers 126, a polymer formation process may be carried out prior to the dry etching of the amorphous silicon layer 125. In the polymer formation process, a polymer film is formed on each side wall of the photoresist film pattern 127. The polymer formation process is carried out for about 45 seconds after the formation of the photoresist film pattern 127 using a rainbow 4528 device manufactured, as a parallel planar system, by LRC Company under the condition using a chamber pressure of about 400 mT, RF power of about 800 W while flowing, in the chamber, argon gas at a flow rate of about 200 SCCM, $CHF_3$ gas at a flow rate of about 30 SCCM, and $CF_4$ gas at a flow rate of about 15 SCCM.

By this polymer formation process, a polymer, which is a byproduct of the polymer formation process, is deposited on the side walls of the photoresist film pattern 127. When the amorphous silicon layer 125 is patterned in accordance with the above mentioned dry etch process while using the photoresist film pattern 127 formed with the polymer as an etch mask, it is possible to reduce the space between adjacent lower electrode layers 126 to about 0.2 $\mu$m.

After the formation of the lower electrode layers 126 of amorphous silicon using the above mentioned dry etch process, the photoresist film pattern 127 is removed using an ashing and stripping process. The exposed surfaces of the lower electrode layers 126 are cleaned. Using a hydrofluoric acid, a natural oxide film on the surface of each lower electrode layer 126 is removed. The resulting wafer is then loaded in a chamber defined in an ultra-high vacuum CVD device. In the chamber, the wafer is subjected to a well-known crystal seeding process and thermal treatment process, so as to grow hemispherical grains 128 on the surfaces of the lower electrode layers 126 of amorphous silicon. This will be described in more detail. First, the chamber of the ultra-high vacuum CVD device is maintained at an ultra-high vacuum of $10^{-9}$ Torr. In this state, the wafer is heated to a desired temperature ranging from 500° C. to 620° C. in the chamber. Under this condition, source gas such as silane ($SiH_4$) or disilane ($Si_2H_6$) is supplied into the chamber, so that crystal nucleuses are formed on the lower electrode layers of amorphous silicon. After the formation of the crystal nucleuses, the resulting wafer is subjected to a thermal treatment in high vacuum. By this thermal treatment, the crystal nucleuses are grown into hemispherical grains. Consequently, the lower electrode layers of amorphous silicon are transformed into a polysilicon layer having an irregular surface by the thermal treatment carried out at 800° C.

Figure 8:
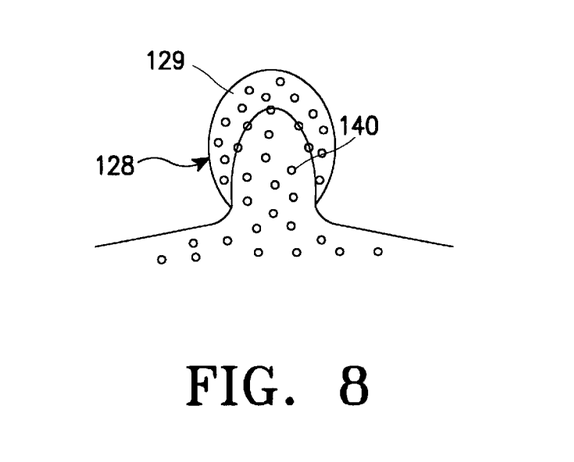

FIG. 8 is an enlarged view of one of hemispherical grains 128. Referring to FIG. 8, it can be found that there is a well migration of P ions 140 to the surface 129 of the hemispherical grain 128. This is because the dry etching of the amorphous silicon layer 125 is carried out while minimizing the etch damage of the amorphous silicon layer 125, so that there is no defect on the side walls of the lower electrode layers 126 of amorphous silicon. Accordingly, P ions can easily migrate from the lower electrode layers 126 to the surfaces 129 of the hemispherical grains 128, thereby preventing the dopant concentration at those surfaces 129 from being reduced.

Figure 9:
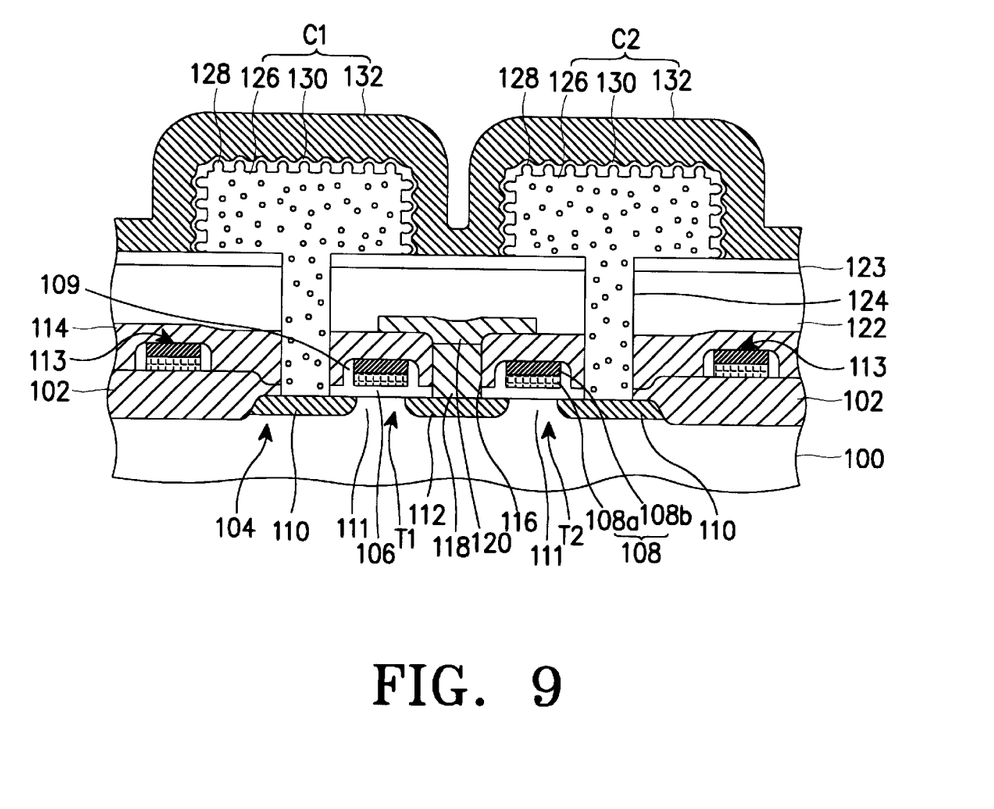

FIG. 9 illustrates the step of completely forming capacitors C1 and C2. After the formation of the lower electrode layers 126 with the above mentioned hemispherical grains 128, dielectric layers 120 having, for example, an ONO (oxide/nitride/oxide) structure are formed on the lower electrode layers 126, respectively, as shown in FIG. 9. Thereafter, a polysilicon layer doped with an N type dopant, for example, P ions, is deposited to a thickness of about 2,000 Å on each of the dielectric layers 120 using an LPCVD process, thereby forming an upper electrode layer 132. Thus, storage capacitors C1 and C2 are obtained.

As apparent from the above description, in accordance with the capacitor fabrication method of the present invention, the patterning of the lower electrode layer of a capacitor is carried out using a dry etch process while minimizing the etch damage of the amorphous silicon layer. After this patterning, hemispherical grains are grown over the lower electrode layer. Accordingly, dopant ions doped in the lower electrode layer can easily migrate from the lower electrode layer to the surfaces of the hemispherical grains, thereby preventing the dopant concentration at those hemispherical grain surfaces from being reduced. Thus, a high Cmin/Cmax ratio is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating an integrated circuit capacitor including a lower electrode layer provided at a surface thereof with hemispherical grains, an upper electrode layer, and a dielectric layer interposed between the lower and upper electrode layers, comprising the steps of:

forming an electrically insulating layer on a substrate;

forming an amorphous silicon layer on the electrically insulating layer;

dry etching the amorphous silicon layer to define the lower electrode layer, by dry etching the amorphous silicon layer using the first etching gas mixture having a ratio of hydrobromide gas (HBr) to chlorine gas ($Cl_2$) therein of at least about 4:1; and then dry etching the amorphous silicon layer and the electrically insulating layer using a second etching gas mixture having a ratio of hydrobromide gas to chlorine gas of at least about 5:1; and then forming hemispherical silicon grains on the lower electrode layer.

* * * * *